(12) United States Patent
Atobe et al.

(10) Patent No.: US 6,350,138 B1
(45) Date of Patent: *Feb. 26, 2002

(54) SOCKET FOR REMOVABLY MOUNTING ELECTRONIC PARTS HAVING A PLURALITY OF CONDUCTIVE TERMINALS SUCH AS BGA PACKAGES

(75) Inventors: Takeyoshi Atobe, Susono; Kiyokazu Ikeya, Sunto-gun; Toyokazu Ezura, Kawasaki, all of (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/616,206

(22) Filed: Jul. 13, 2000

(30) Foreign Application Priority Data

Aug. 30, 1999 (JP) .............................. 11-243520

(51) Int. Cl.[7] .............................................. H01R 11/22
(52) U.S. Cl. ...................................................... 439/266
(58) Field of Search ........................ 439/259, 263–266, 439/268, 330, 331

(56) References Cited

U.S. PATENT DOCUMENTS

| | | |
|---|---|---|
| 4,750,891 A | 6/1988 | Egawa |
| 5,017,152 A | 5/1991 | Matsuoka |
| 5,147,213 A | 9/1992 | Funk et al. |
| 5,482,471 A | 1/1996 | Mori et al. |
| 5,690,281 A | 11/1997 | Ikeya et al. |
| 6,027,355 A | 2/2000 | Ikeya et al. |
| 6,050,836 A | 4/2000 | Tohyama |

*Primary Examiner*—Khiem Nguyen
(74) *Attorney, Agent, or Firm*—Russell E. Baumann; Frederick J. Telecky, Jr.

(57) ABSTRACT

A socket having a base (2) which can removably mount a BGA package (9) and a plurality of contact members (6) which are arranged in conformity with the pattern of terminal solder balls (11) of BGA package (9) on base (2) and which have a pair of arms (6a) and (6b) that are capable of opening or closing for pressure contact in the state of sandwiching each terminal of BGA package (9). Partition walls (4a) are provided on slider (4) which is capable of moving in a direction normal to the opening and closing direction of arms (6a) and (6b), the partition walls engage with the pairs of arms of the contact maker (6) respectively, with the arms (6a) and (6b) being opened or closed by the movement of the partition wall.

13 Claims, 15 Drawing Sheets

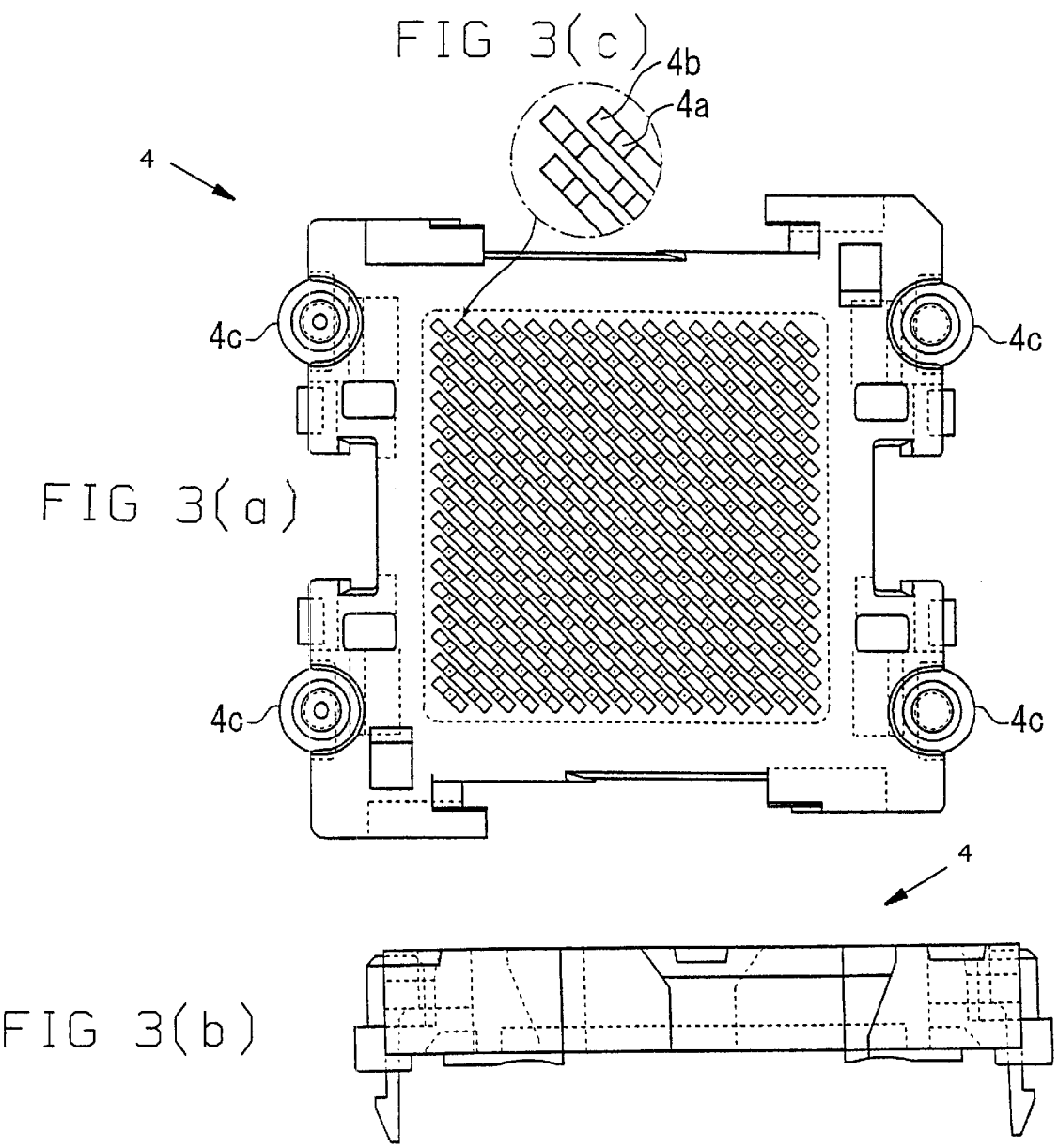

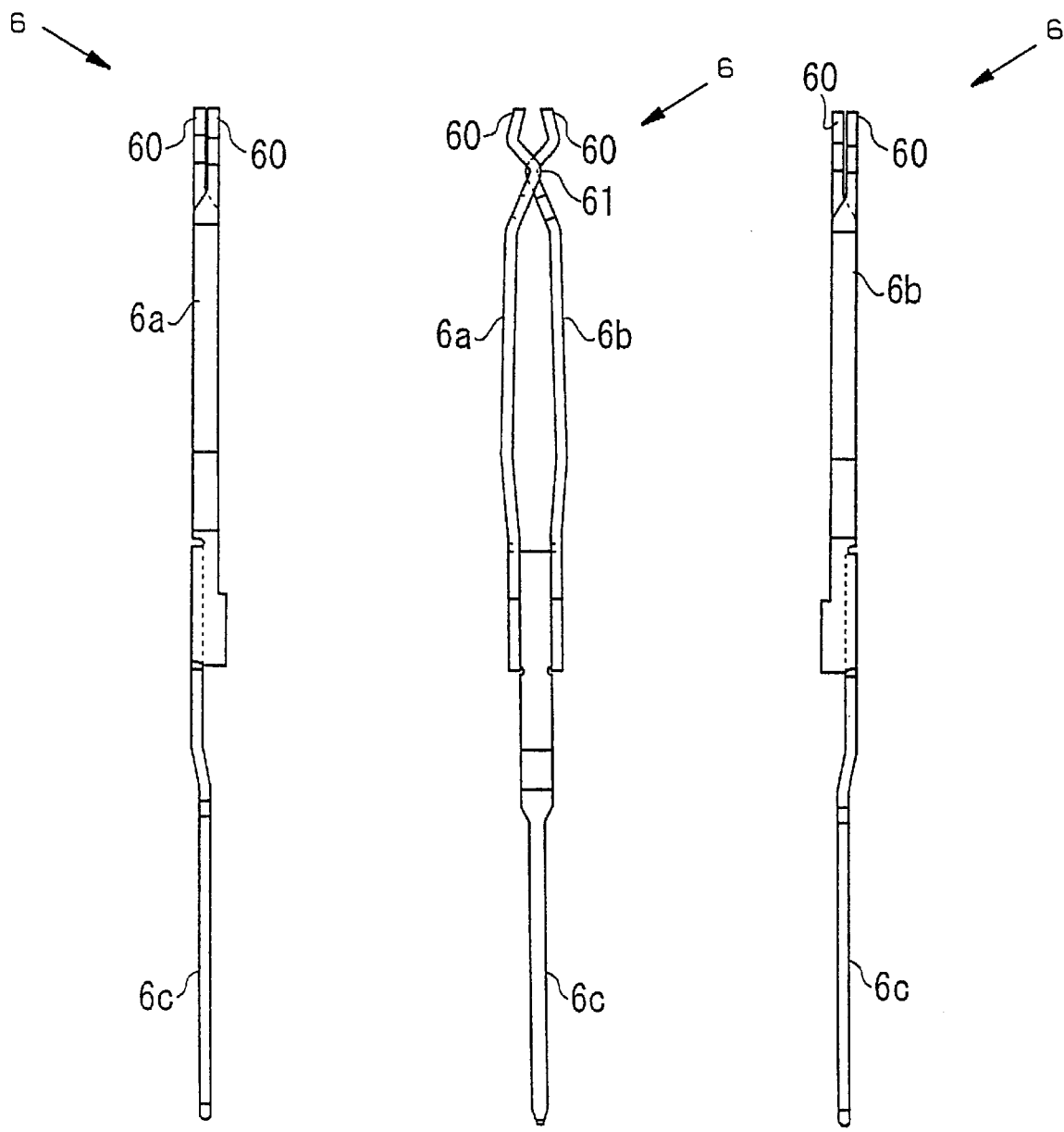

SOCKET FOR REMOVABLY MOUNTING ELECTRONIC PARTS HAVING A PLURALITY OF CONDUCTIVE TERMINALS SUCH AS BGA PACKAGES

FIELD OF THE INVENTION

This invention relates to a socket for removably mounting an electronic part which has a large number of terminals on its lower surface and for electrically connecting each terminal to external equipment and more particularly to a socket which is suitable for BGA (Ball Grid Array) packages.

BACKGROUND OF THE INVENTION

Generally, resin sealed IC packages are subjected to an electrical property and/or reliability test called a burn-in test prior to their shipment from the semi-conductor manufacturer in order to distinguish between acceptable and defective products. In electrical property tests, the input-output characteristics, pulse properties, noise leeway, and the like, of the IC chip are tested. According to the burn-in test, on the other hand, IC packages which have passed the electrical property test are arranged in an oven and are operated for a certain period of time at a power source voltage which is approximately 20% higher than the rated value and at an elevated temperature, such as 125° centigrade, for example. IC packages found to be unsatisfactory in the burn-in test are separated with only those IC packages that continued operating satisfactorily shipped out as acceptable products.

BGA packages having terminals comprising spherically-shaped solder balls arranged in a selected matrix such as in a zigzag fashion on the lower side of the package have become popular. Among the advantages of BGA packages are: the terminal pitch can be widened while maintaining a small outside dimension and the terminal is sturdy, thereby making it less likely to be damaged in case of engagement with some other part.

FIGS. 10(a) through 10(c) show prior art sockets for burn-in tests for loading a BGA package. As shown, socket 101 has a square base 102 made of resin and, on base 102, a slider 103 for mounting the BGA package 100 is arranged for movement in the horizontal direction for the purpose of mounting BGA package 100. A cover 104 made of resin and having an opening 104a is disposed on top of base 102. Cover 104 is movable upwardly away from the base and downwardly toward the base by a compression coil spring 105. A bore is formed through slider 103 and base 102 that corresponds to each solder ball 100a of the BGA package. A contact 106 for the pressure connection of solder ball 100a of the BGA package is so arranged as to run through respective bores of slider 103 and base 102. Each contact 106 is made of a longitudinal metallic member having a tip end formed with a pair of arms 106a and 106b. As shown in FIGS. 10(a) through 10(c), each contact 106 is fixed to base 102 and extends in a direction generally perpendicular to the top and bottom surfaces with arms 106a and 106b facing upwardly. As shown in FIG. 10(c), contact 106 is formed in such a way that arms 106a and 106b open by means of a tab (not shown in the drawing) provided on arm 106a which is engaged with the partition wall 103a of slider 103.

A slide mechanism for moving slider 103 in parallel with the bottom surface of the base 102 is provided on both sides of slider 103. The mechanism includes a lever member 108 which is approximately in the shape of an L installed for free rotatable motion at both ends of a shaft 109 which has been provided on one of the edges (the right-hand edge in the drawing) of base 102 and the short arm 108a of this lever member 108 is linked, freely rotatable, to shaft 107 received in vertically extending slots formed in slider 103. In addition, a lever member 111 is mounted, freely rotatable, on both ends of shaft 110 that has been provided on the other opposite side of base 102 and the tip of lever member 108 is mound freely slidable in a slot, at the middle part of lever member 111 by means of a pin 112. Moreover, the tip 111a of lever member 111 engages protuberant part 104a of the ceiling surface of cover 104 when the cover is in its raised position. In addition, there is provided a compression coil spring 113 for biasing the slider 103 to the right as seen in FIGS. 10(a), 10(b).

In a socket 101 made as described above, when the cover 104 is pressed downwardly from the position shown in FIG. 10(a) to that shown in FIG. 10(b), lever members 108 and 111 rotate toward base 102 and, in conformity with the movement of lever member 108, shaft 107 biases slider 103 moving the slider in the X-direction (to the left as seen in FIGS. 10(a), 10(b). As a consequence of this, one arm 106b of contact 106 opens in engagement with the partition wall 103a of slider 103. If, in this state, the BGA package 100 is dropped into the adaptor 103 of slider 103, each solder ball 100a of the BGA package 100 enters between the arms 106a and 106b of a respective contact 106.

When the force upon the cover 104 is released, moreover, the lever members 108 and 111 also rise and the slider 103 returns in the X+ direction by the force of the compression coil spring 113, with a consequence that the arms 106a and 106b of each contact close and that, therefore, each solder ball 100a of the BGA package 100 is held by arms 106a and 106b of each contact 106. As a result of this, each solder ball 100a of the BGA package 100 and each contact 106 can be electrically connected.

In the case of such a socket according to the prior art, however, there has been a problem of inadequate durability of contacts 106 due to a large amount of stress generated in arms 106b because of the fact that, in connection with the mounting of the BGA package 100, the tip part is caused to open by bending arms 106b of the contacts 106. Due to the fact that the center of the opening in which each solder ball 100a is to be dropped shifts by the amount of the opening of one of the arms 106b, there also has been a problem in that, when the amount of the opening of arms 106b has been adjusted, the location, of the drop-in will have to be adjusted so that the solder ball 100a may drop into the proper position. In the case of conventional technology, moreover, in connection with the mounting of a BGA package 100 on a socket 101, there is a situation where the position of the BGA package shifts as the solder ball 100a contacts the tip of a contact 106, with a resultant shifting of the position of the BGA package, thereby causing a contact failure or a mounting failure of the BGA package 100. In some extreme cases, the tip of a contact 106 is sometimes damaged by solder ball 100a of BGA package 100. According to the prior art, moreover, there is a problem in that the solder ball 100a of BGA package 100 and the arms of contact 106 sometimes stick to each other after the completion of the burn-in test, thereby making it difficult to remove the BGA package 100.

SUMMARY OF THE INVENTION

An object of the present invention is the provision of a socket which avoids the limitations of the prior art described above. Another object is the provision of a socket with improved durability of the contact members that hold the terminals of an electronic part. Yet another object of the invention is the provision of a socket that is capable of preventing any damage to the biased contact parts of the contact members in connection with the mounting of the electronic part as well as improving the mountability of the electronic part. Still another object of the invention is the provision of a socket which is capable of preventing a failure in the removal of the electronic part subsequent to the test.

In accordance with the invention a main socket body is capable of removable loading an electronic part whose terminals are arranged in the main body part according to a selected pattern. A plurality of contact members are arranged on the main socket body in conformity with the arrangement pattern of the terminals of said electronic part. The contact members each have a pair of arm-like contact parts which are capable of elastically opening or closing in the state of having held a respective terminal of the electronic part. A contact switching member which has an engagement part that engages with the pairs of arm-like contact parts of the contact members opens or closes the arm-like contact parts by the movement of the engagement part. Each arm of the pairs of arm-like contact parts have respectively been made to open or close, with a result that there is no possibility of generating a large amount of stress at one of the arm-like contact parts upon attachment or detachment as in the case of the prior art. Accordingly, it becomes possible to generate uniform stresses by uniformly opening each arm-like contact part. As a consequence of this, it becomes possible by this invention to reduce the maximum bending amount of the arm-like contact parts of the contact members. Accordingly, the durability of the contact members is drastically increased. According to a feature of the invention, the center of opening where the terminal of the electronic part is to be deposited always remains at a constant position as each arm-like contact part opens evenly. Even in the case where the amount of the opening of the arm-like contact parts have been adjusted, therefore, it becomes unnecessary to adjust the drop-in position of the terminals, thereby making it possible to improve the efficiency of the inspection stage.

Accordingly to the invention, further, it becomes possible to increase the compressive force on the terminals of the electronic part compared with the prior art since the compressive force is exerted in opposite directions on the electronic part from each arm-like contact part. Therefore, it thus becomes possible to improve the contact reliability for the electronic part. The force generated is of such a size as is equal in opposite directions against the terminals of the electronic part from each arm-like contact part in connection with the removal of the electronic part from the socket. Compared with conventional technology, therefore, it becomes possible to increase the separation force from the terminals of the electronic part, with a resultant possibility of preventing the possible adherence of the terminals of the electronic part to the arm-like contact parts after completion of the test.

According to a feature of certain embodiments of the invention, the engagement part that engages at least one of each pair of arm-like contact parts of the contact members opens or closes said arm-like contact parts by movement of the engagement part in cooperation with an electronic part seating member provided on the main socket body which moves in conformity with the opening or closing of the arm-like contact parts provided. Thus, it becomes possible in connection with the mounting of an electronic part on the socket to cause relative separation of the electronic part from the arm-like contact parts, thereby avoiding contact between the terminals of the electronic part and the contact parts. According to the invention, therefore, there is no shifting of the position in connection with the mounting of the electronic part, with a result that the mountability of the electronic part can be improved and, at the same time, any possible damage to the biased contact part of the arm-like contact parts can be prevented. According to the invention, moreover, it becomes possible to forcefully pull the connective terminals of the electronic part away from the arm-like contact parts, as by moving the electronic part seating member when the electronic part is detached from the socket. Even in the case where a terminal of the electronic part is fixed to an arm-like contact part, therefore, it becomes possible to accurately take the electronic part out of the arm-like contact parts. In the invention, the realization can be easily achieved when the contact part switching member has an engagement part that engages with each of the pair of arm-like contact parts of said contact members, with said arm-like contact parts being made to open or close through the movement of this engagement part.

According to a feature of one embodiment of the invention, the engagement part which engages with each of the pair of arm-like contact parts of the contact members thereon has a slide member which is capable of sliding in a direction which is approximately normal to the opening and closing direction of the arm-like contact parts of said contact members. According to the invention, it is possible to freely select the opening and closing direction of the contact members. Therefore, it becomes possible to expand the freedom of design including a modification of the opening and closing direction of the contact members. According to one embodiment, the engagement part that engages with each of the pair of arm-like contact parts of the contact members provided thereon has a slide member that is capable of sliding in the opening and closing direction of the arm-like contact part of the contact members.

According to a feature of the invention, a plurality of bores are formed at positions which correspond to the plurality of contact members on the slide member and, at the same time, the engagement part which is adjacent to each of these bores engages at least one of the said arm-like parts of each pair and opens or closes said arm-like contact parts by the up and down movement of the engagement part.

These and other objects of the invention will be apparent from the following description taken with reference to the accompanying drawings.

BRIEF DESCRIPTION OF THE DRAWINGS

FIG. 3(a) is a top plan view of the slider of the FIG. 1(a) socket;

FIG. 3(b) is a front view of the FIG. 3(a) slider;

FIG. 3(c) is an enlarged broken away portion of FIG. 3(a);

FIGS. 5(a)–5(d) are front, sides and top view respect of one of the contact members of the FIG. 1(a) socket;

DETAILED DESCRIPTION OF PREFERRED EMBODIMENTS

Figure 1A:
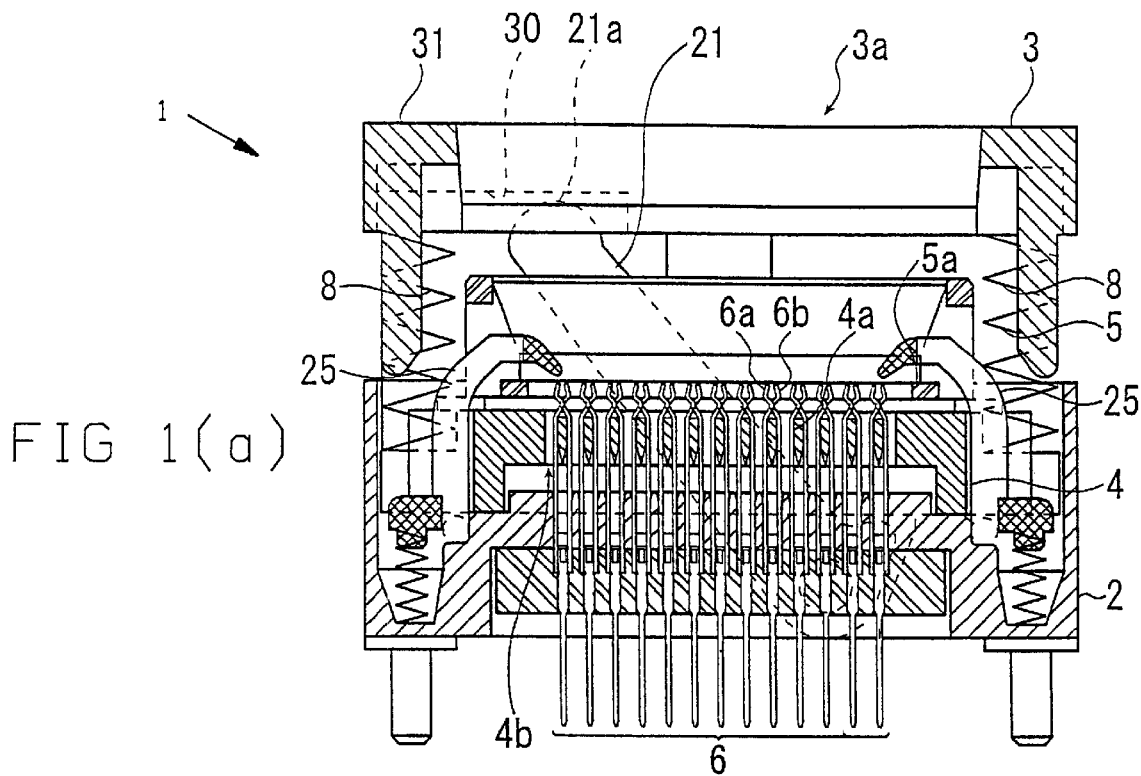
FIG. 1(a) is a cross sectional view of a socket made in accordance with the invention shown with the cover in the raised position.

With reference to FIGS. 1(a)–5(b), a socket made according to a first embodiment comprises a base 2 as the main socket body, a cover 3, a slider 4 mounted on base 2 which serves as a contact part switching member, and an adaptor 5 mounted on slider 4. These components are formed of a suitable resin material such as polyetherimide, to cite an example. Base 2 is to be attached to a circuit substrate such as a printed substrate, etc. which is not shown in the drawing. The base is formed in a selected configuration, such as a square shape. A plurality of bores 2b are formed through base 2 at its center for holding respective contact members 6 as will be described later.

Figure 2A:
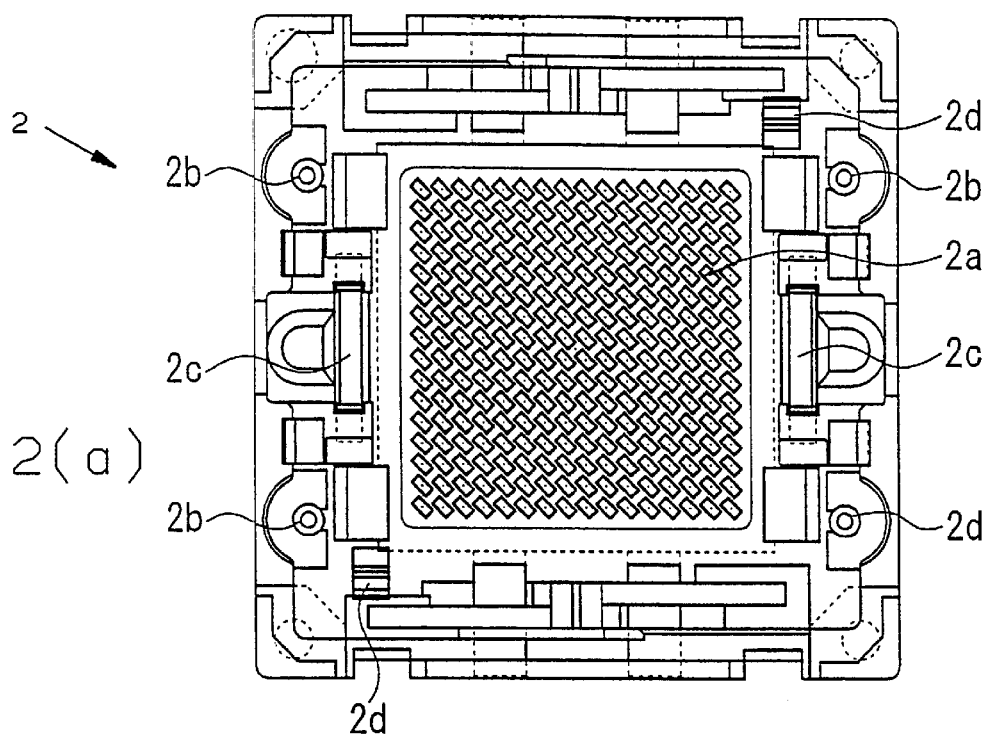
FIG. 2(a) is a top plan view of the base of the FIG. 1(a) socket.
Figure 2B:
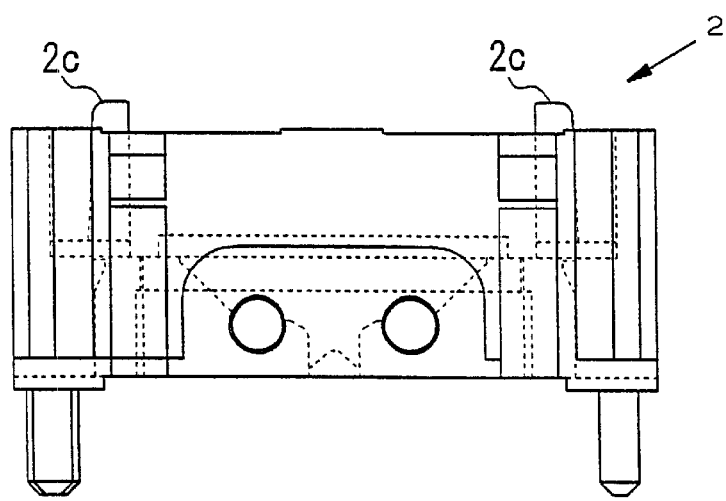
FIG. 2(b) is a front elevational view of the FIG. 2(a) base.
Figure 2C:
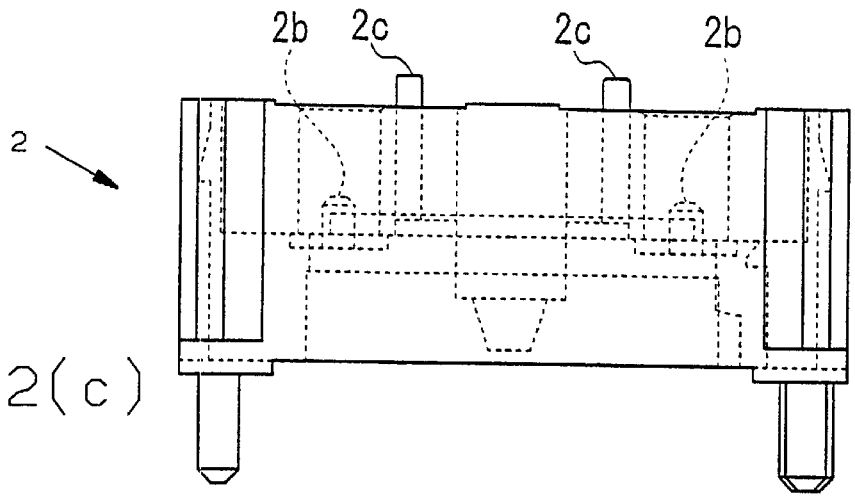
FIG. 2(c) is a side view of the FIG. 2(a) base.
Figure 2D:
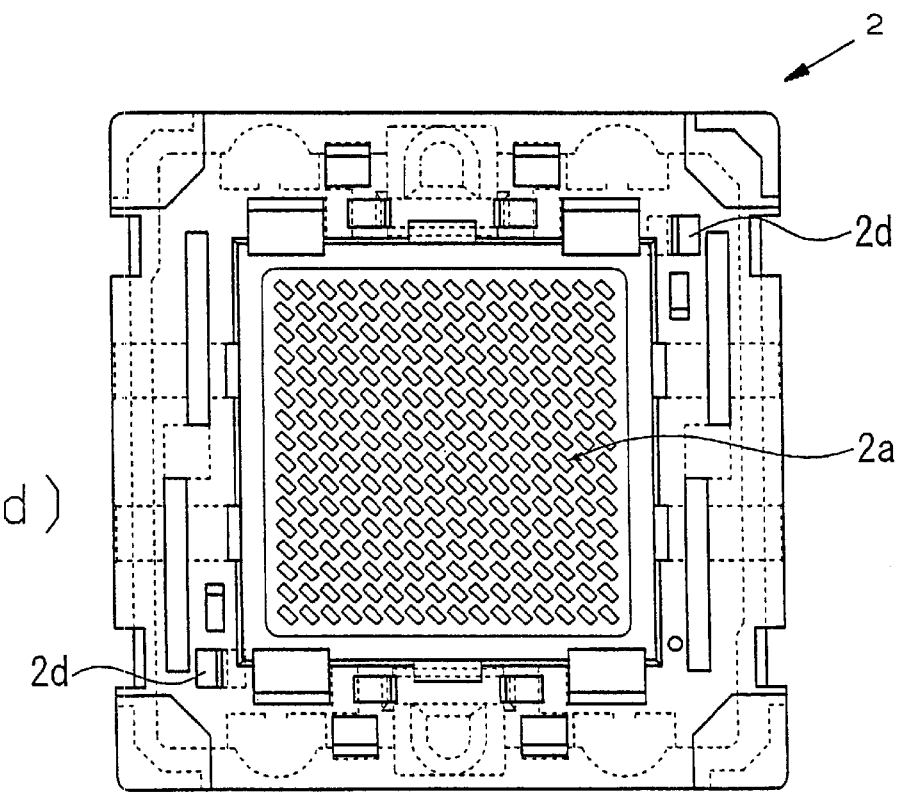
FIG. 2(d) is a bottom plan view of the FIG. 2(a) base.

Four guide parts 2b (FIG. 2(a)) in the shape of rails1 for positioning slider 4 and a pair of guide parts 2c for positioning and installing adaptor 5 are provided on base 2 extending in a direction generally normal to the top surface of the base. Cover 3, formed in the shape of a square frame which has a size comparable to the size of the base, is formed with an opening 3a at the center thereof for the purpose of inserting the BGA package (electronic part). Base 2 and cover 3 are relatively movable toward and away from each other while maintaining a mutually parallel state. Compression coil springs 8 are provided between cover 3 and base 2, in order to bias cover 3 away from base 2. A plurality of bores 4b, which will be described later, extend through slider 4 at those positions which correspond to bores 2a formed in base 2 as shown in FIGS. 3(a)–3(e). On the peripheral edge of slider 4, moreover, a positioning part 4c is provided which can slide in engagement with the guide part 2b of base 2 described above. Slider 4 is movable upwardly and downwardly maintaining a parallel relationship with cover 3 along guide part 2bby a mechanism to be explained below.

Figure 1B:
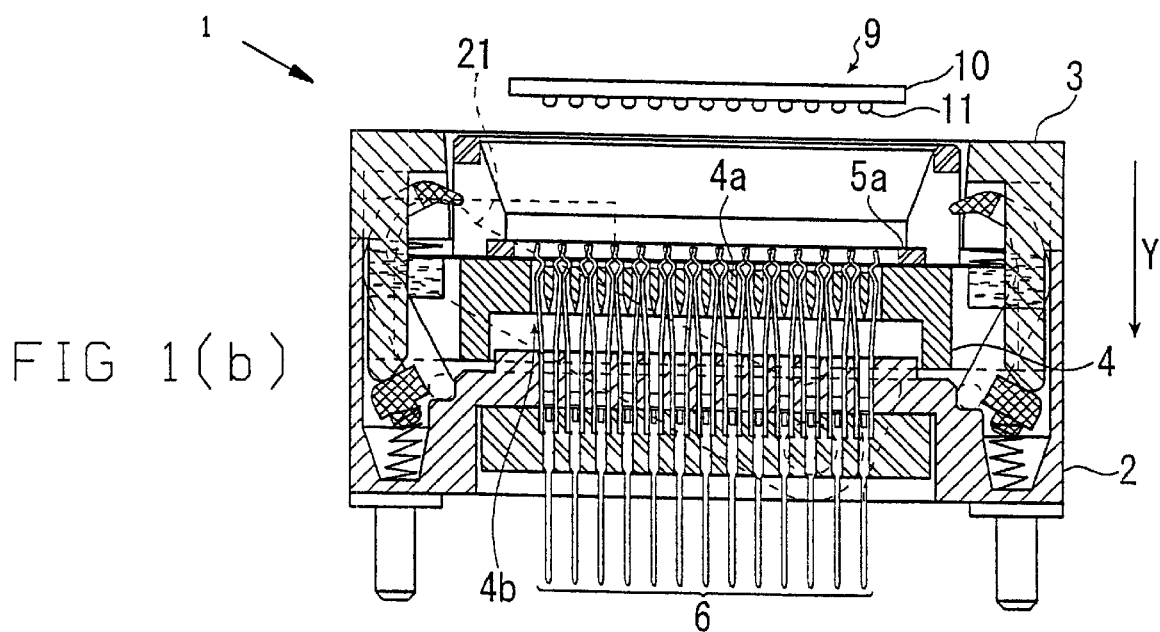
FIG. 1(b) is a cross sectional view similar to FIG. 1(a) but shown with the cover in the lowered position and showing an electronic part in the form of a BGA package to be inserted therein.
Figure 1C:
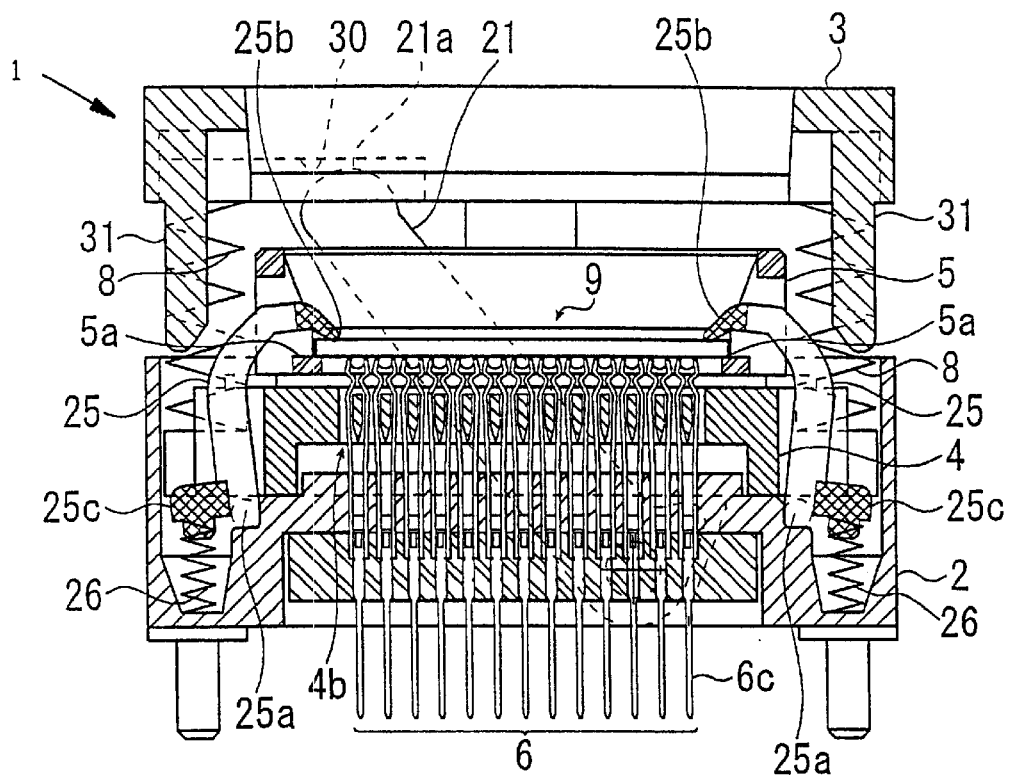
FIG. 1(c) is a cross sectional view similar to FIG. 1(a) but showing the socket with the BGA package mounted therein.
Figure 1D:
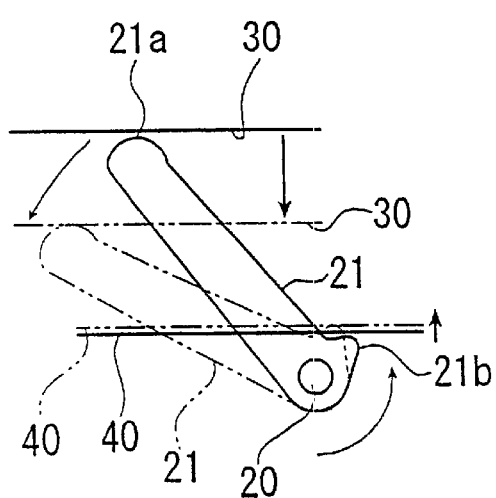
FIG. 1(d) is an explanatory figure showing the action of the lever member of the FIG. 1(a) socket.

As shown in FIGS. 1(c)–(d), a lever member 21, rotatable in the direction of base 2 or cover 3, on a support shift 20 is arranged at a location below slider 4 of base 2 at the center thereof and one end tip 21a of this lever member 21 is adapted to touch surface area 30 provided inside cover 3. An operating protrusion 21b of lever member 21 adjacent support shaft 20 serves as the function point of the lever. Operating protrusion 21b engages the lower part 40 of slider 4 and pushes the slider upwardly with the lowering of lever member 21. According to this embodiment, the operating surface area 30 of cover 3 is formed in such a way that it lies in a plane parallel with the plane of the upper surface 31 of cover 3. However, operating surface 30 can be formed with a tilt of a selected angle, if desired. As the operating surface 30 of the cover 3 is tilted, the friction between the tip part 21a of the lever member 21 and the operating surface 30 of the cover 3 becomes smaller, with a consequence that it becomes possible to reduce the force needed to depress cover 3, thereby improving the operability.

According to this embodiment, BGA package 9 has a plurality of solder balls 11 which serve as terminals formed in a selected pattern on one of the surfaces of substrate 10. The diameter of the solder balls 11 is approximately in the range between 0.3 and 0.75 millimeters and the pitch between the adjacent solder balls 11 is approximately in the range between 0.5 and 1.27 millimeters. A seating part (electronic part seating part) 5a for mounting the BGA package 9 is provided. As show n in FIGS. 4(a)–4(d), a pair of latch portions 5b are formed in such a way as to extend the normal line of the seating part 5a and these latch portions 5b are inserted into a hole 2d (FIG. 2a ) provided on base 2. A pair of positioning holes 5c are formed on the side of the adaptor 5 at positions facing each other which are adapted to engage with the guide part 2c of the above described base 2.

Figure 1E:
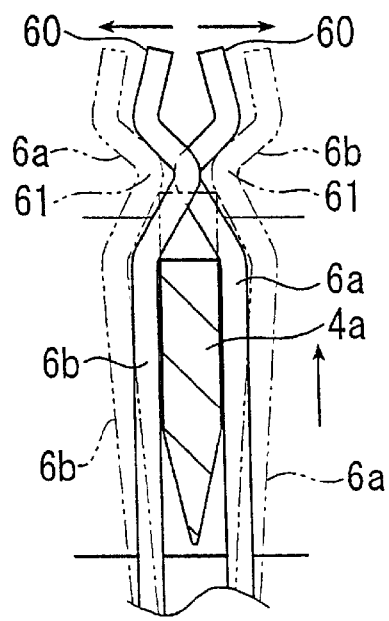
FIG. 1(e) is an explanatory figure showing the action of the slider and a contact member in the FIG. 1(a) socket.

As shown in FIGS. 1(a) and 1(b), contact members are provided at positions which correspond to solder balls 11 provided on the lower side of package 10 of the BGA package 9. Each contact member 6 is made of a longitudinal extending member made of suitable metal such as beryllium copper, etc., and has arms 6a and 6b as a pair of arm-like contact parts as in the above described example of prior art. Contact member 6 is integrally formed by the sheet metal processing of a metal plate, for instance. As shown in FIGS. 5(a)–5(d), contact member 6 has a terminal portion 6c at one end and a pair of arms 6a and 6b which extend toward the opposite end. The pair of arms 6a and 6b of the contact 6 face each other and are shaped symmetrically relative to the axis which extends in the longitudinal direction of contact 6. An engagement protrusion 61 is provided in each arm 6a and 6b by bending that part which is in the vicinity of each respective tip in the shape of an elbow or convey shaped portion facing in the direction of mutual approach. Contact members 6 are adapted to be inserted from the back of the base 2 subsequent to the installation of slider 4 on base 2. As shown in FIGS. 1(a)–1(c) and 1(e), meanwhile, a lattice-like partition wall 4a which serves as an engagement part is provided at the center of the slider, thereby forming a large number of holes 4b extending through the slider. In each contact member, moreover, the contact parts 60 at the tip of arms 6a and 6b are biased toward each other and extend through hole 4b so as to protrude from the top of slider 4. Arms 6a and 6b of each contact 6 are arranged in such a fashion as to sandwich the partition wall 4a of the slider 4 and, moreover, to cause the engagement protrusion 61 to be positioned above the partition wall 4a of slider 4. As shown in FIGS. 1(a) and FIG. 1(e), furthermore, the engagement protrusions 61 of the biased contact part 60 of arms 6a and 6b may overlap each other to some extent in the case where the slider 4 is located on the side of the base 2.

As shown in FIGS. 1(a)–1(c) a pair of latches 25 are provided for preventing any "floating" of BGA package 9 that has been mounted in the socket. Each latch 25 is formed so that its cross section is generally J-shaped and, as its lower distal tip 25a is freely rotatably supported on base 2, the upper distal tip 25b of the latch 25 either approaches or withdraws from the pressurized contact parts of the contact members. When no external force is exerted, latches 25 may be provided with a bias toward the side of the pressurized contact part 60 of the contact member 6 by the spring force of the compression coil springs 26 that is transmitted through a linkage part 25c. However, as the compression portion 31 of cover 3 engages the said linkage part 25c of each latch 25 along with the pressing down of cover 3, tip 25b of each latch 25 moves away from the pressurized contact part 60 of contact 6 by the action of the lever.

Figure 3D:
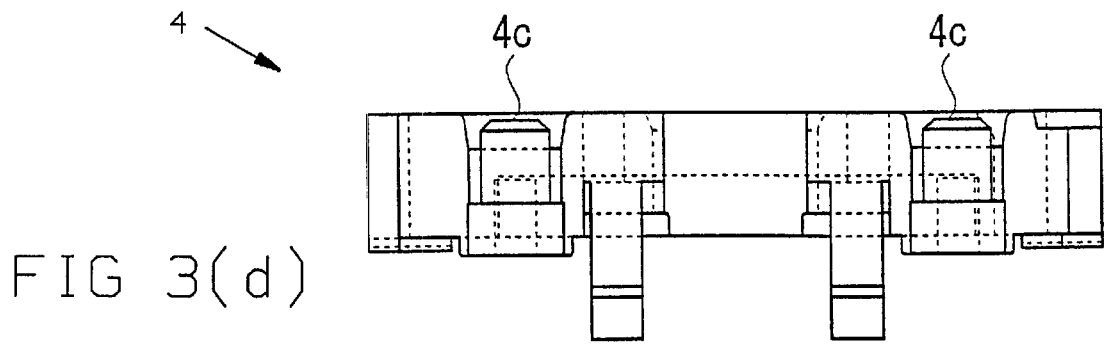
FIG. 3(d) is a side view of the FIG. 3(a) slider.
Figure 3E:
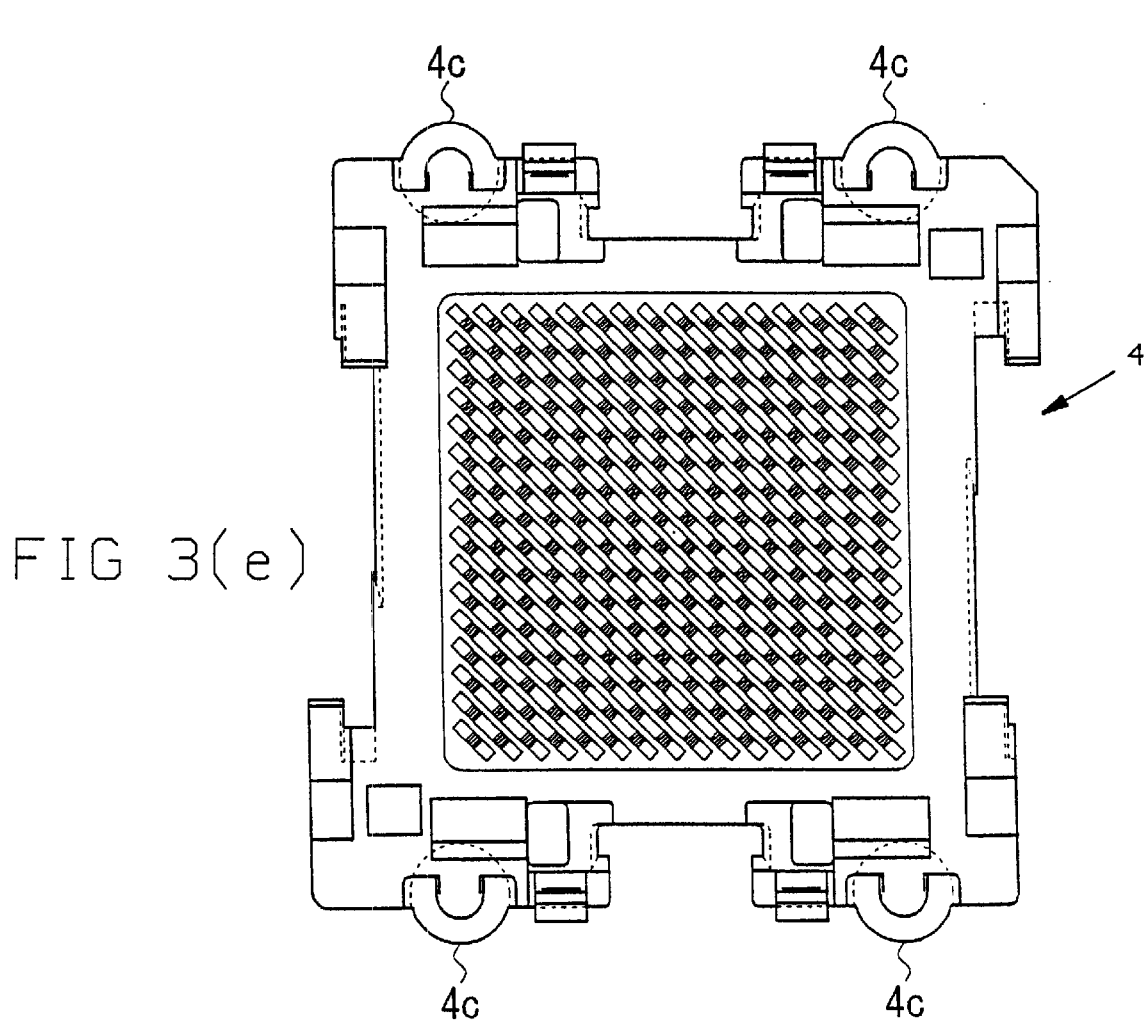
FIG. 3(e) is a bottom plan view of the FIG. 3(a) slider.
Figure 4A:
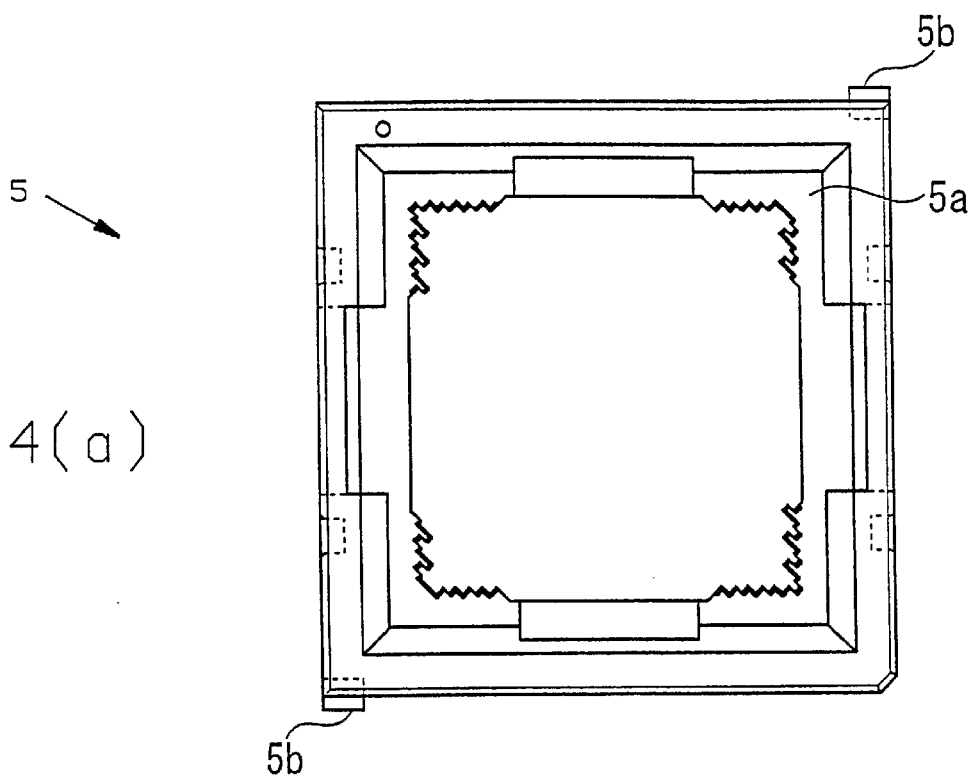
FIG. 4(a) is a top plan view of the adaptor of the FIG. 1(a) socket.
Figure 4B:
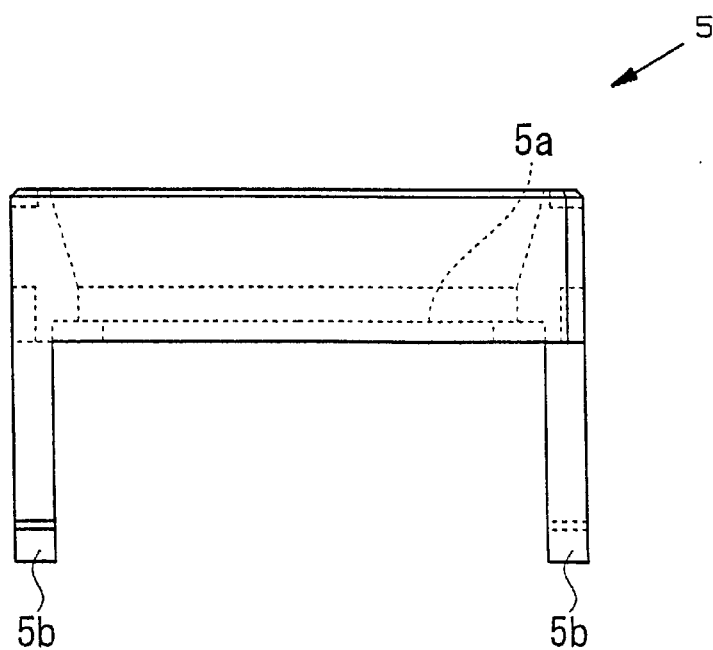
FIG. 4(b) is a front view of the FIG. 4(a) adaptor.
Figure 4C:
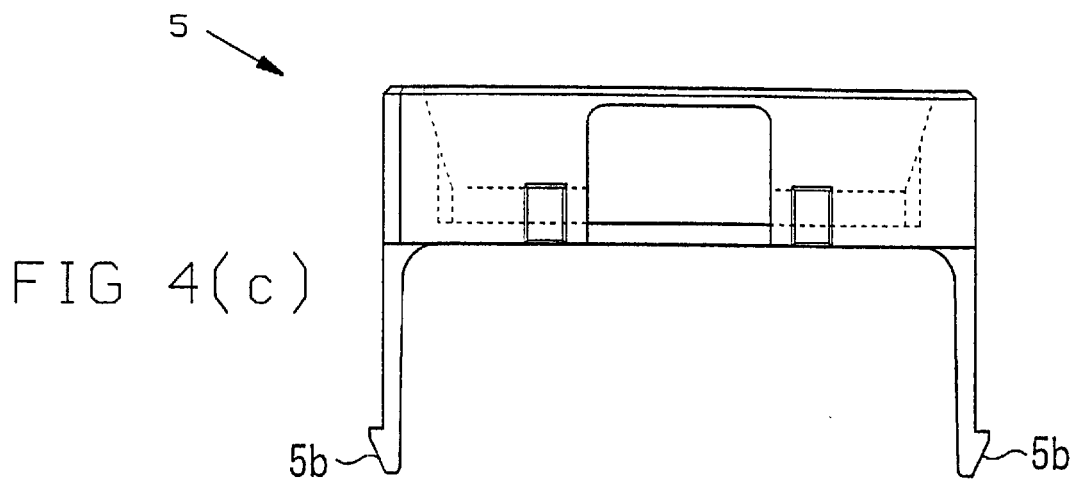
FIG. 4(c) is a side view of the FIG. 4(a) adaptor.
Figure 4D:
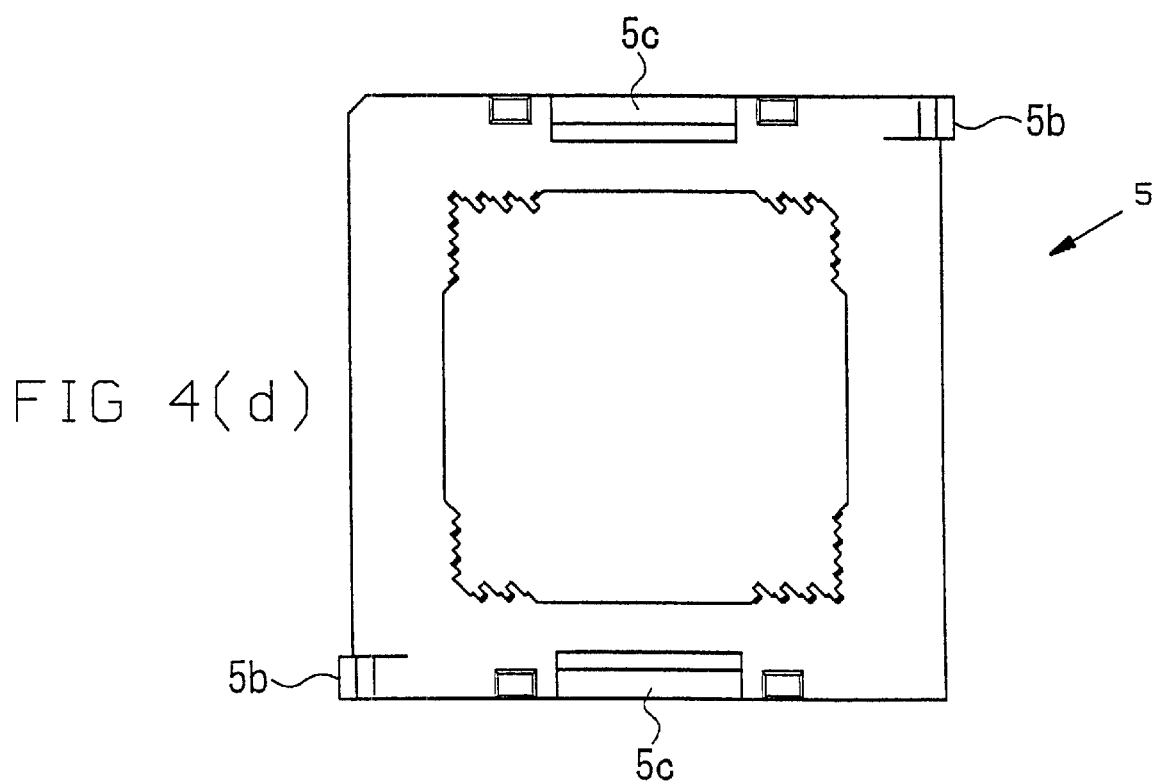
FIG. 4(d) is a bottom plan view of the FIG. 4(a) adaptor.

Cover 3 is located at a position which is away from the base 2 by the force of compression coil springs 8 as shown in FIG. 1(a) when the cover 3 is not being depressed. Therefore, operating surface 30 of cover 3 and the lever member 21 are not in engagement with each other. Because of this, lever member 21 and the bottom 40 of the slider 4 are not in engagement with each other as shown by the solid line in FIG. 1(d). In this state, therefore, each contact member is closed as shown in FIGS. 1(a) and FIG. 3(e). If cover 3 is pressed down from this state in the Y-direction, lever member 21 is pressed down along with the cover as shown in FIG. 1(b). Because of this, the operating protrusion part 21b of lever member 21 engages the bottom 40 of slider 4, thereby pushing up slider 4. As a result of this, partition wall 4a of the slider 4 engages the engagement protrusion 61 of each contact member 6, with a consequence that arms 6a and 6b of each contact member move by the same distance and the pressurized contact part 60 opens, as shown in FIGS. 1(b) and FIG. 3(e). In this state, each latch 25 is removed from the vicinity of the contact member 6 as shown in FIG. 1(b) and is movable to the seating portion 5a of the adaptor 5 when the BGA package 9 is inserted from the opening 3a of the cover 3.

Then, an action which is opposite to the action described above takes place as the compressive force on the cover 3 is released, with a result that arms 6a and 6b of each contact member are closed with a respective solder ball 11 of BGA package 9 in pressure-engagement by the biased contact part 60 of each arm 6a and 6b as shown in FIGS. 1(b) and 1(c). The BGA package can be taken out by pressing the cover once again to open the arms of the contacts.

According to this embodiment as described above, the pairs of arms 6a and 6b are opened or closed. Uniform stress is generated by causing each of the arms 6a and 6b to open evenly. Thus, the maximum bending amount of the arms 6a and 6b of contact members 6 can be reduced, thereby drastically increasing the life-span of the contact members 6.

Therefore, there is no possibility for a large amount of stress to be generated in one of the arms 6a and 6b at the time of the attachment or detachment as in the case of the prior art. Further, according to this embodiment since arms 6a and 6b open evenly, the center of that part where the solder ball 11 of the BGA package 9 is inserted remains at a fixed position at all times. Even in the event where the amount of the opening of the arms 6a and 6b has been adjusted, there will be no need to adjust the drop-in position of the solder balls 11. As a consequence of this, the efficiency of the inspection step can be improved. Since compression forces of the same size and in opposite directions work on solder balls 11 of the BGA package 10 from arms 6a and 6b, the compression force against the solder ball 11 can be increased as compared with the prior art to improve the contact reliability against the solder ball 11. According to this embodiment, meanwhile, forces of the same size work against the solder ball 11 in the opposite directions from arms 6a and 6b even when the BGA package 9 is removed from the socket 1. Therefore, it is possible to increase the peel-off force against the solder balls 11 as compared with the prior art, thereby making it possible to prevent the adhesion of arms 6a and 6b to the solder balls 11 subsequent to the test.

Since slider 4 is moved in a direction which is perpendicular to the opening and closing direction of the arms 6a and 6b, the operating protrusion 21b of the lever member 21 can be located at the bottom of slider 4 to make the socket 1 more compact. According to this embodiment, further, it becomes possible to freely select the opening and closing direction of the arms 6a and 6b. Thus, it becomes possible to increase the freedom of design including a variation in the opening and closing direction for each contact member 6. It is mentioned in this connection that this invention is not to be limited to the above described example forms but can be modified in various manners as will be explained below.

FIGS. 6 through 9 relate to other embodiments of the invention. Those parts which correspond to the forms of the above described examples will be given the same reference characters and their detailed explanations will be omitted.

Figure 6A:
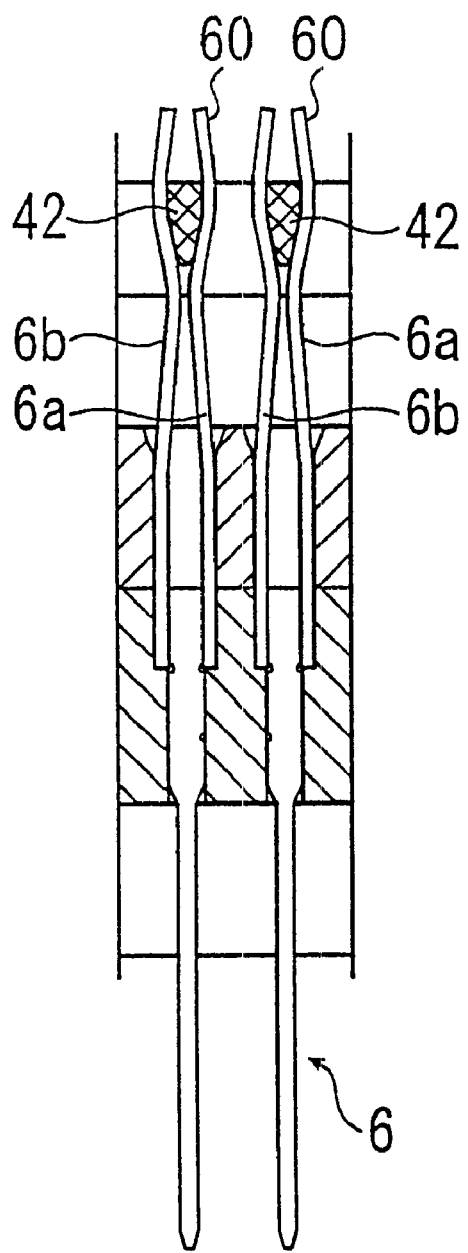
FIGS. 6(a), 6(b) are simplified views showing contact members and engagement elements of another embodiment of the invention with the contacts in the closed and open positions respectively.
Figure 6B:
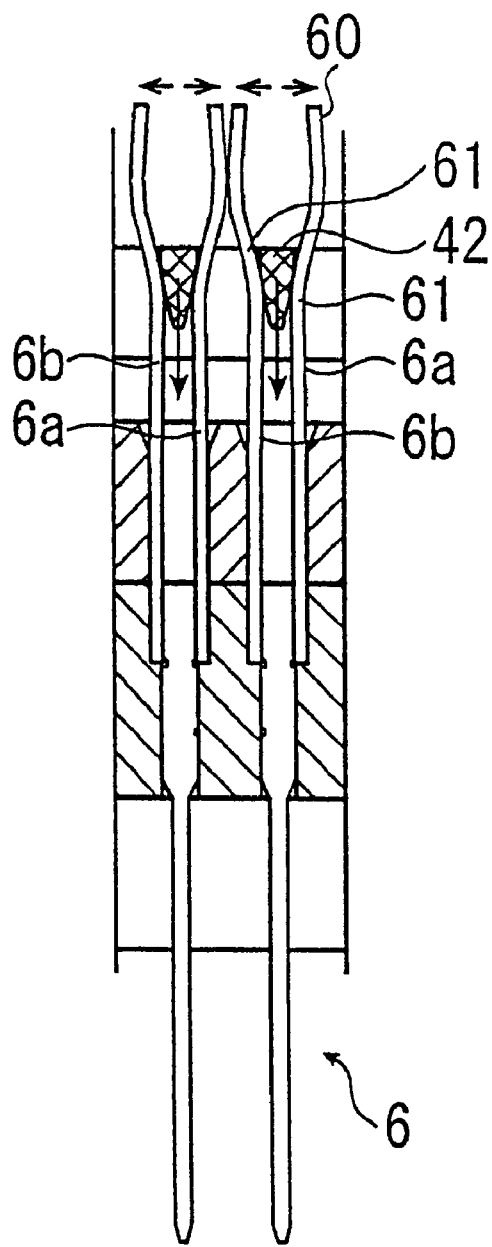

In the first embodiment described above, slider 4 is moved from the base 2 toward cover 3. In the next embodiment, however, the slider 4 is moved from the standard position toward the base 2 and the respective partition walls 42 are forced against the engagement protrusion 61 of the arm 6a and 6b of each contact member as is shown in FIGS. 6(a), 6(b) for instance. Thus, the lever, the cam and the shaft, etc., become unnecessary, thereby making it possible to obtain a socket having a compact construction and, at the same time, the number of the parts involved can be reduced. Thus, it is advantageous from the standpoint of the cost. As to the other structure, function and effect, they are the same as in the form of the above example; therefore, no details shall be given here.

Figure 7A:
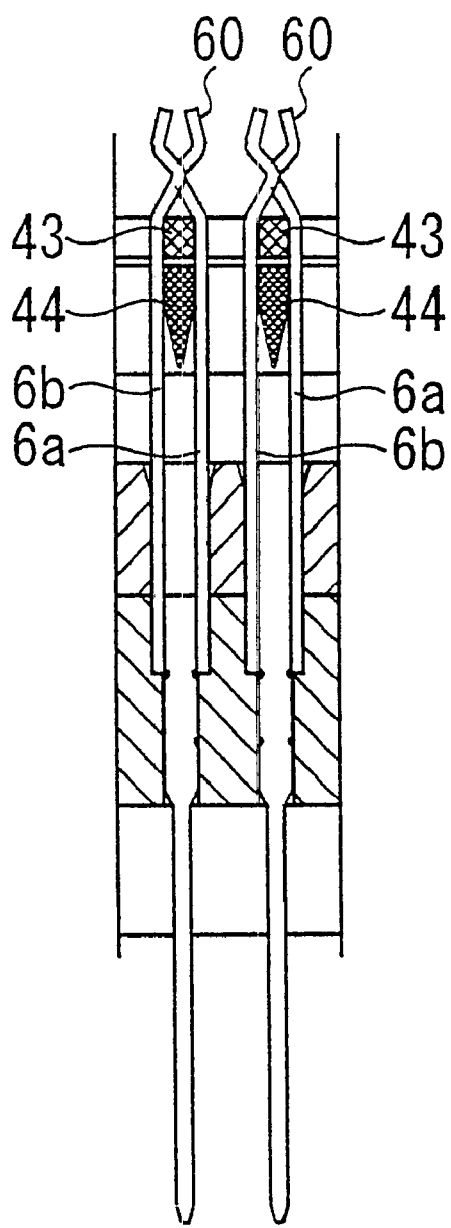
FIGS. 7(a), 7(b) are simplified views similar to FIGS. 6(a), 6(b) showing another embodiment of the invention with the contacts in the closed and open positions respectively.
Figure 7B:
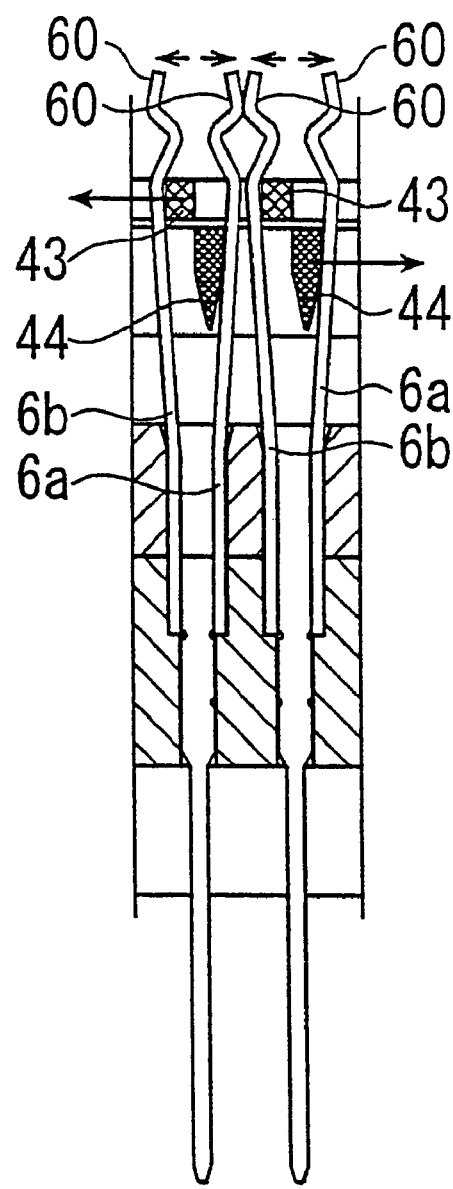

With reference to FIGS. 7(a), 7(b), moreover, two kinds of partition walls 43 and 44 are provided on the slider 4 and, by employing a lever, for example, the partition walls 43 and 44 are moved in mutually opposite directions, thereby making is possible for the arms 6a and 6b to be biased for opening and closing. According to this embodiment, the sliding range of the slider 4 (partition walls 43 and 44) and the contact member 6 is small compared with the case where the slider 4 is moved upwardly and downwardly making it possible to reduce the wear of the slider 4, thereby increasing its durability. In view of the fact that the technology of horizontally moving the slider 4 has long since been established, it is advantageous from the standpoint of easily achieving reliability of the action. Since the other structure, functions and effects are the same as in the form of the above example, an explanation of their details will be omitted here.

Figure 8A:
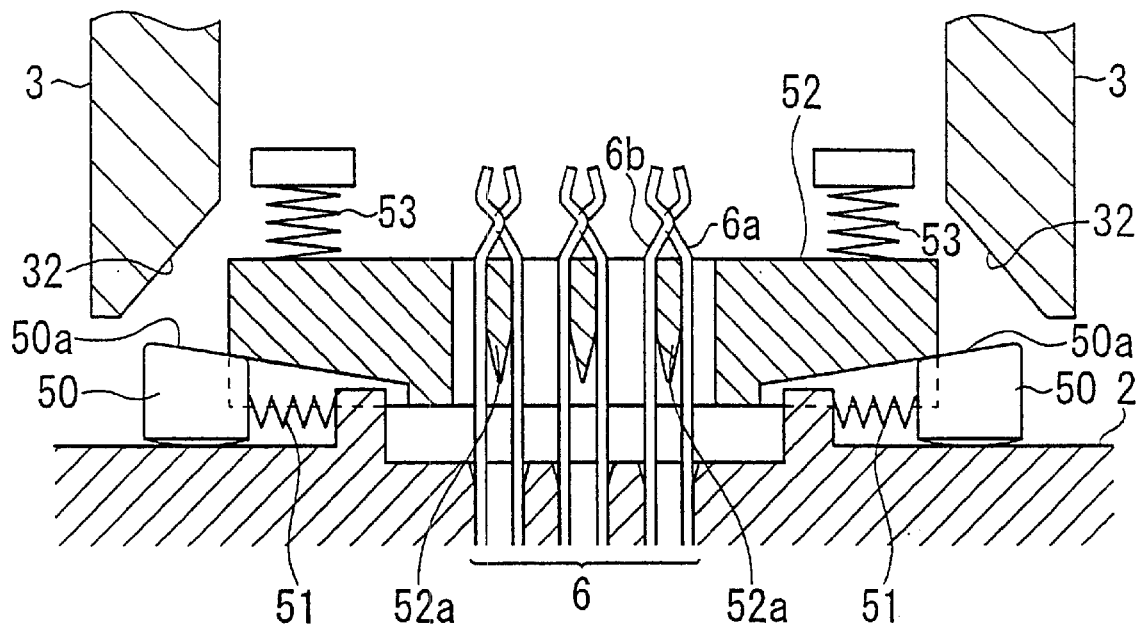
FIGS. 8(a), 8(b) are simplified views showing contact members and related components of another embodiment of the invention with the contacts in the closed and open positions respectively.
Figure 8B:
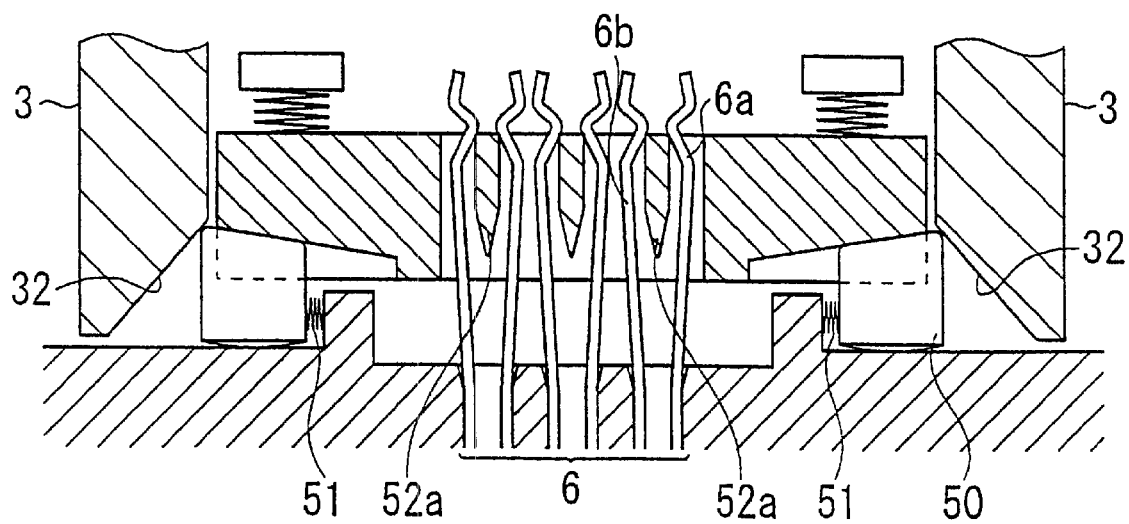

Opening or closing arms 6a and 6b of each contact member 6 can be effected by using two kinds of sliders 4. With reference to FIGS. 8(a), 8(b) in one such embodiment, a pair of first sliders 50, capable of moving in the same direction as the opening and closing direction of arms 6a and 6b, are provided on the base 2. First sliders 50 are engaged with the tapered surfaces 32 of a prescribed angle that has been provided on cover 3, thereby making it possible for movement to be made toward contact members 6 in opposition to the force of compression coil springs 51. A taper 50a of a selected angle is provided on first sliders 50 which cooperates with second slider 52 adapted to move toward the side of cover 3 in opposition to the force of the compressive coil springs 53. Thus, it becomes possible to open or close arms 6a and 6b of each contact member 6 by the partition wall 52a of slider 52 in conformity with the movement of cover 3. Further, slider 52 is pushed upwardly by a plurality of tapered surfaces 50a of the first slider 50. Therefore, the contact members 6 can be opened or closed smoothly and accurately. In view of the fact that the other structure, functions and effects are the same as in the form of the above described example, an explanation of their details shall be omitted.

Figure 9A:
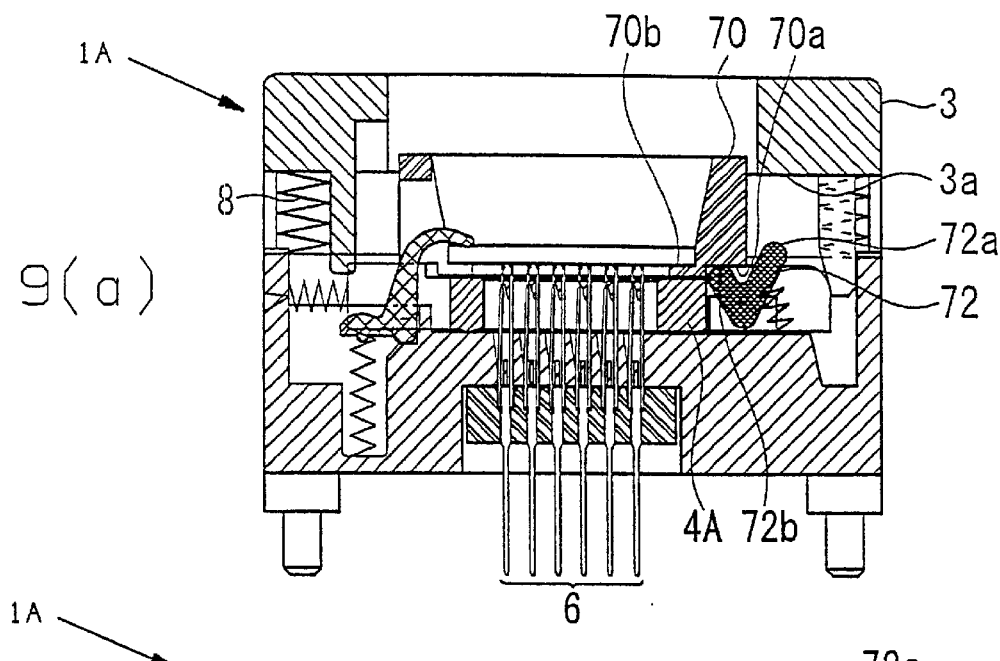
FIG. 9(a) is a cross sectional view of a socket made in accordance with another embodiment of the invention, shown with the cover in the raised position.
Figure 9B:
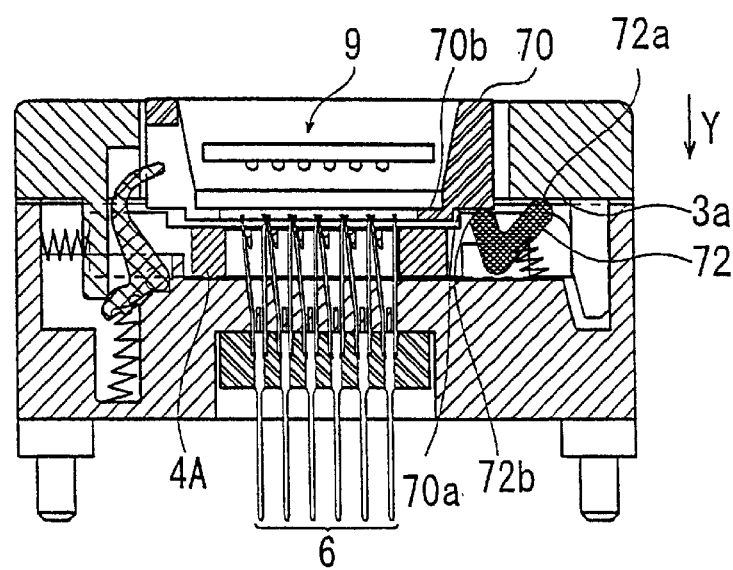
FIG. 9(b) is a cross section similar to FIG. 9(a) but shown with the cover in the lowered position and shown with an electronic part (BGA package) partially inserted.
Figure 9C:
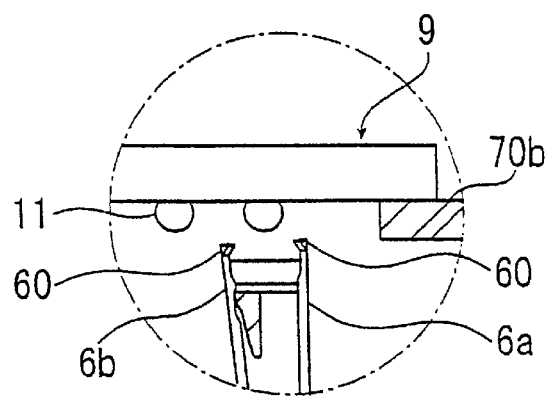
FIG. 9(c) is an enlarged view of a portion of FIG. 9(b) but with the BGA package seated.

FIGS. 9(a), 9(b) show a socket according to another embodiment of the invention. Socket 1A comprises a slider 4A which is capable of sliding in a direction which is parallel to the opening and closing direction of arms 6a and 6b of contact members 6 by means of a mechanism similar to the prior art described above with one of the arms 6b of the contact members 6 being moved by slider 4A. Adaptor 70 is movable (upwardly and downwardly movement) in parallel with cover 3 along a guide part which is not shown in the drawing by means of the following mechanism. As shown in FIGS. 9(a) through 9(c), lever member 72 is rotatable in the direction of base 2 or cover 3, with a support shaft that is disposed at least partly at a location which is lower than adaptor 70 of base 2 as the center and the tip part of this lever member 72a is caused to touch the operating surface 3a that has been provided inside of cover 3. An operating protrusion 72b is provided in the vicinity of the support shaft of lever member 72 which serves as the force transfer point of the lever and this operating protrusion 72b is constructed in such a manner that it engages the lower part 70a of adaptor 70 as the lever member 72 is pushed down, thereby pushing adapter 70 upwardly. Cover 3 normally is disposed at a location away from base 2 due to the force of the compression coil springs 8 as shown in FIG. 9(a). Accordingly, operating surface 3a of cover 3 and lever member 72 are not in engagement with one other and the adaptor is arranged at a position on the side of the slider 4A.

Figure 9D:
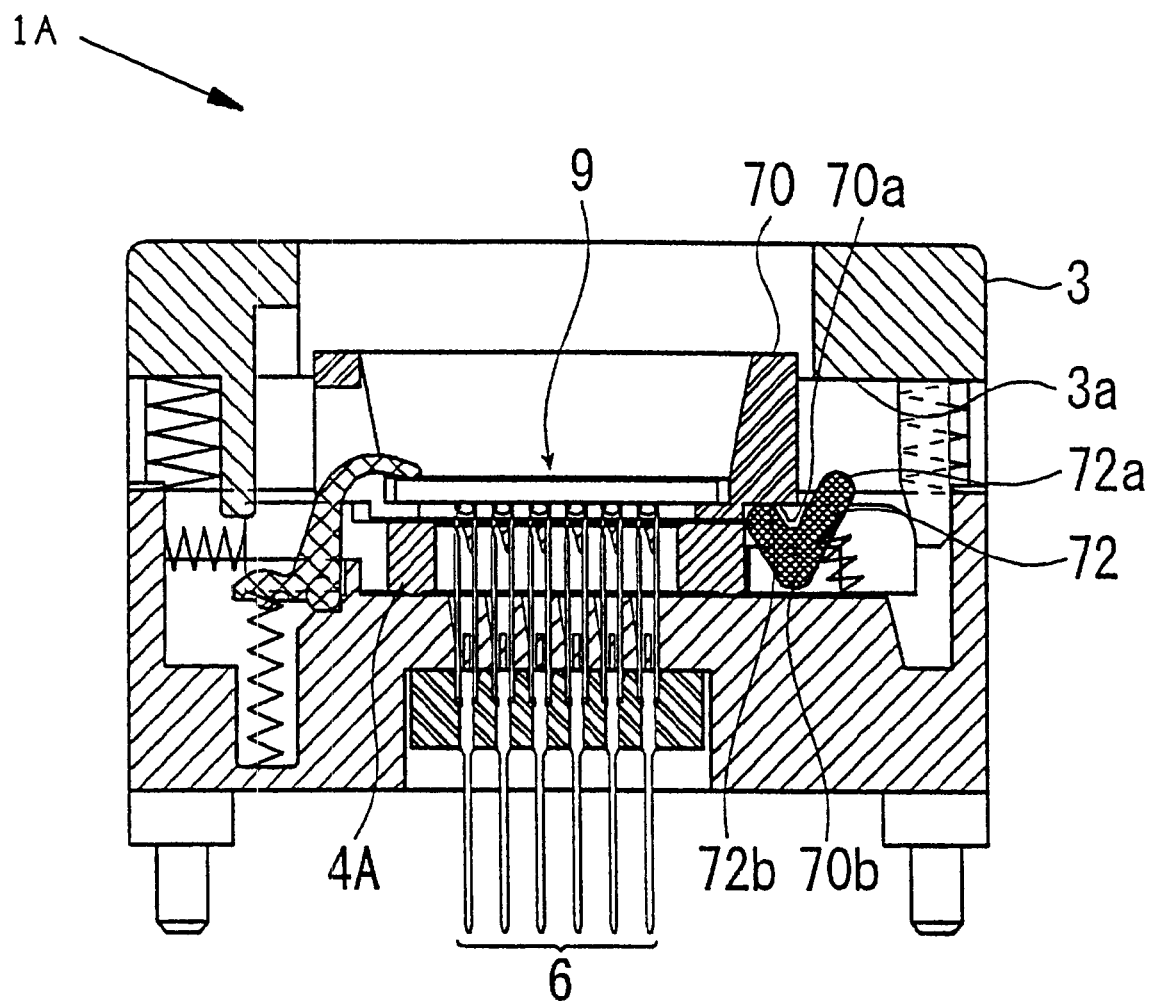
FIG. 9(d) is a cross sectional view similar to FIG. 9(a) but shown with the BGA package mounted therein.
Figure 10A:
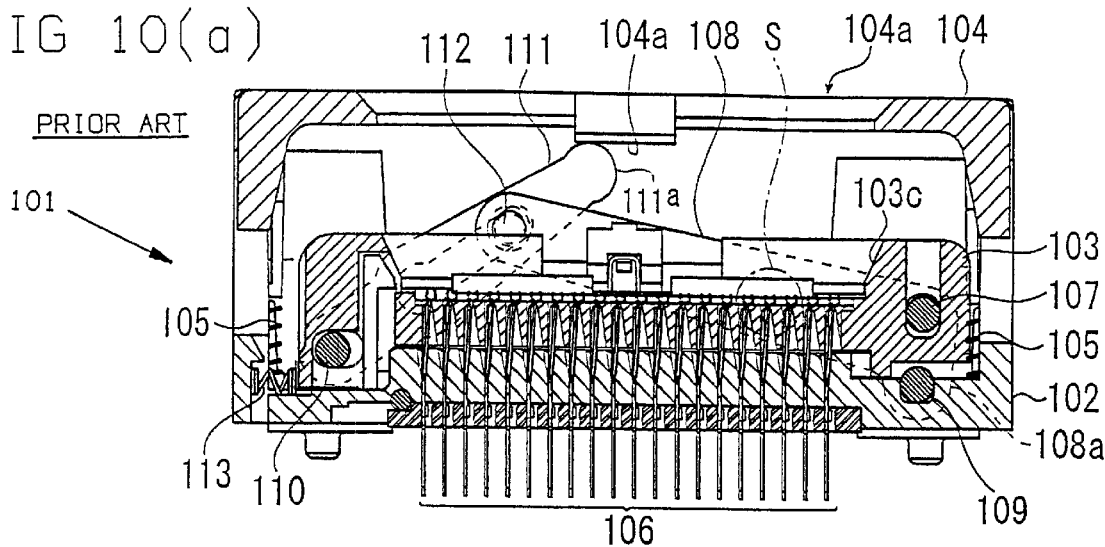
FIG. 10(a) is a cross sectional view of a prior art socket shown with the cover in the raised position.
Figure 10B:
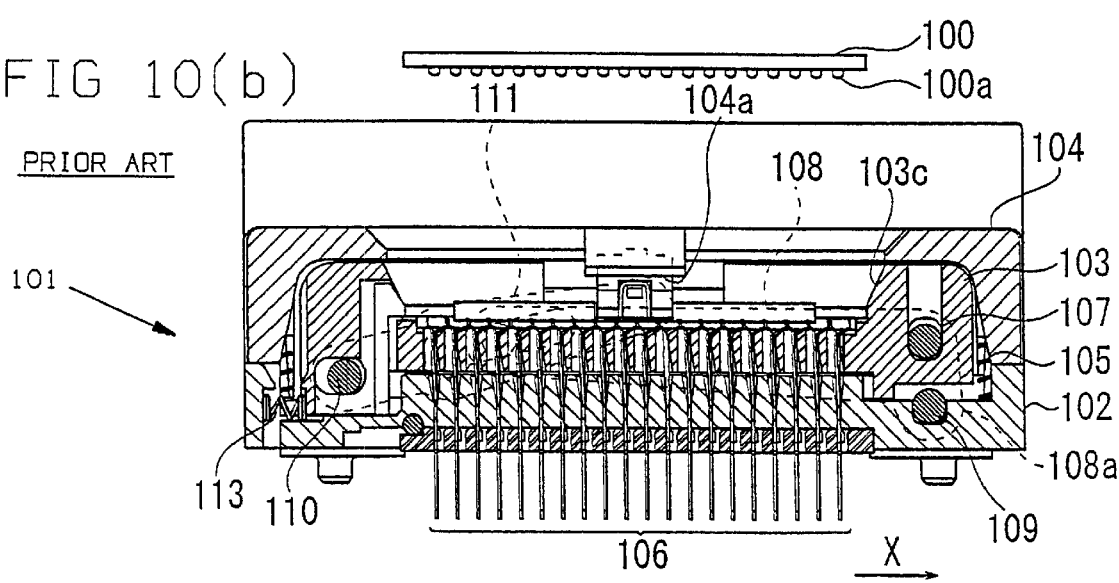
FIG. 10(b) is a cross sectional view similar to FIG. 10(a) but shown with the cover in the lowered position and shown with a BGA package to be inserted.
Figure 10C:
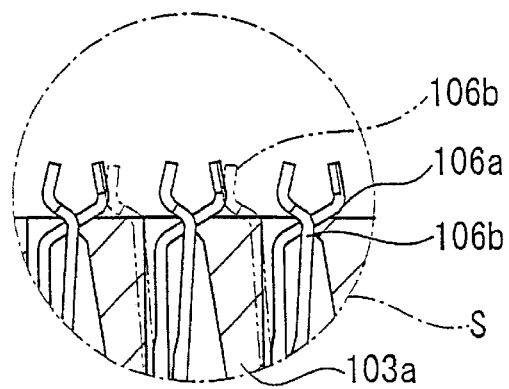
FIG. 10(c) is an enlarged portion of FIG. 10(a).

When cover 3 is pushed downwardly from the FIG. 9(a) position in the Y-direction, lever member 72 is pushed down along with cover 3 as shown in FIG. 9(b). As a result of this, the operating protrusion 72b of lever member 72 engages the lower part 70a of the adaptor, thereby causing the adaptor 70 to be pushed upwardly. In this state, BGA package 9 is inserted through a central opening of cover 3 while the cover remains in the lowered position and is placed on the seating part 70b of adaptor 70. Adaptor 70 shifts by a prescribed distance to a position on the side of cover 3 as shown in FIG. 9(c). Therefore, the solder balls 11 of a BGA package 9 that has been placed on the seating portion 70b of the adaptor 70 are located above the upper end of the arms 6a and 6b of each contact member. As the downward force on cover 3 is removed thereafter, an action which is opposite to the above described action takes place and the adaptor 70 is restored to the original position by using a spring, etc., which is not shown in the drawing and, at the same time, arms 6a and 6b of each contact member are closed. As is shown in FIG. 9(d), each solder ball 11 of the BGA package 9 is compressively contacted by a respective biased contact part 60 of each arm 6a and 6b. Seating portion 70b which is movable in conformity with the opening and closing state of arms 6a and 6b is formed on the adaptor 70. Accordingly, when BGA package 9 is about to be mounted on socket 1A, the seating portion 70b is moved away from arms 6a and 6b, thereby making it possible to avoid any contact between the solder ball 11 of the BGA package 9 and the biased contact part 60 of the arms 6a and 6b. As a consequence of this, there will be no dislocating motion in connection with the mounting of BGA package 9 according to this embodiment. Thus, the mountability of BGA package 9 is improved and, at the same time, any possible damage to the tips of the arms 6a and 6b is prevented. It is also possible to forcefully pull BGA package 9 from the biased contact parts 60 of arms 6a and 6b by moving the seating portion 70b in connection with the removal of BGA package 9 from socket 1A. Even in the event BGA package 9 should adhere to the pressurized contact parts 60 of arms 6a and 6b, it is possible to accurately extract BGA package 9 from arms 6a and 6b. The other structure, functions and effects are the same as in the form of the above described example. Therefore, a detailed explanation thereof will be omitted here.

According to the invention which has been described above, the maximum bending amount of the arm-like contact parts of the contact maker is reduced, thereby enhancing the life of the contact maker. There is no need to adjust the position terminals for loading even in the case where the amount of opening of the arm-like contact part has been adjusted. Accordingly, the efficiency of the testing step is increased. In sockets made in accordance with the invention, the mountability of the electronic part is improved and, at the same time, any possible damage to the biased contact parts of the arm-like contact parts is prevented along with adhesion to the electronic part of the biased contact parts after completion of the test. The structure of the socket can be made compact and, at the same time, different opening and closing directions of the contact maker can be selected. Accordingly, freedom of design is increased including, for example, a modification of the opening and closing direction for each contact member.

It should be understood that it is the intention that the invention include all modifications and equivalents of the described embodiments falling within the scope of the appended claims.

What is claimed:

1. A socket comprising a main socket body which is capable of movably loading an electronic part having terminals arranged according to a selected pattern, a plurality of contact members arranged in conformity with the arrangement pattern of the terminals of the electronic part on the main socket body and each of which has a pair of arm-like contact parts which are capable of elastically opening or closing in the state of having held a respective terminal of the electronic part, and a contact switching member which has first and second engagement parts that engage with the pair of arm-like contact parts of the contact members and which opens and closes the arm-like contact parts by movement of the first and second engagement parts in opposite directions.

2. A socket according to claim 1 in which the arm-like contact parts have an opening and closing direction and the contact part switching member has a slide member which includes the engagement part which engages the pairs of arm-like contact parts of the contact members and which is mounted for sliding movement in the opening and closing direction of the arm-like contact parts of the contact members.

3. A socket for mounting an electronic part having a plurality of terminals on at least one face thereof comprising:

a main body, a cover movable upwardly and downwardly, a slide, coupled to the cover and a lever operatively connected to the slide for moving the slide upwardly and downwardly in conformity with the movement of the cover, a plurality of contact members each having a pair of arm-like contact parts having a tip and being capable of opening or closing at the tip, a latch for holding the electronic part that is to be mounted on the body at a selected location, the main body mounting the cover, slide, lever and latch and the plurality of contact members, a plurality of holes formed through the slider at locations which correspond to said plurality of contact members, and an engagement part formed on the slide disposed adjacent to each hole, the engagement part engaging at least one of the arm-like contact parts and opens and closes the arm-like contact parts by the movement of the engagement part.

4. A socket according to claim 3 in which the lever member is rotatably mounted on the main body, the lever being in engagement with the cover, the slide having a bottom formed with a lower surface, and the lever having an operating portion which engages the lower surface at the bottom of the slide.

5. A socket according to claim 4 further comprising an adaptor mounted on the main body to position the said electronic part.

6. Socket apparatus for removably mounting an electronic package having a plurality of terminals arranged in a selected pattern comprising:

a base having a plurality of bores formed therethrough for reception of contact members, a slider mounted on the base for movement toward and away from the base, the slider having a plurality of holes formed therethrough, the holes formed with partition walls, a plurality of electrical contact members mounted on the base, each contact member having first and second elongated contact arms extending from the base and being movable toward and away from each other and having contact tips normally closely spaced from one another, the contact arms received through respective holes in the slider with the first and second arms of each contact member disposed on opposite sides of a partition wall, each contact arm being formed with a partition wall engagement surface normally disposed further from the base than the partition walls, a cover having a centrally located opening therethrough mounted on the base for movement toward and away from the base and being normally biased away from the base, a lever having first and second legs extending from a pivot, the pivot pivotably mounted to the base with the first leg extending to a location adjacent to the cover and the second leg disposed beneath the slider, movement of the cover toward the base causing the cover to push the first leg of the lever to rotate the lever causing the second leg of the lever to push the slider away from the base which in turn moves the partition walls between the arms of each contact member into engagement with the partition wall engagement surface of the contact arms to cause the tips of each contact member to move away from each other.

7. Socket apparatus according to claim 6 further comprising an adaptor member fixed to the base to position the electronic package.

8. Socket apparatus according to claim 6 in which each contact member has a longitudinal axis and the contact arms of each contact member are symmetrical about the respective longitudinal axis, each partition wall engagement surface comprising a convex shaped portion facing in the direction of mutual approach of the respective contact arms.

9. Socket apparatus according to claim 8 in which the partition wall engagement surfaces are formed adjacent to the tips of the contact arms.

10. Socket apparatus according to claim 6 further comprising at least one generally J-shaped latch having a long leg with a distal end pivotably mounted on the base and being pivotable toward and away from the slider, the latch having a force receiving portion extending outwardly from the distal end, a spring member engaging the force receiving portion to bias the latch toward the slider and the cover having a force transfer leg movable into engagement with the force receiving portion to pivot the latch away from the slider against the bias of the spring member.

11. Socket apparatus for removably mounting an electronic package having a plurality of terminals arranged in a selected pattern comprising:

a base having a plurality of bores formed therethrough for reception of contact members, a slider mounted on the base for movement toward and away from the base, the slider comprising a first slide member having a plurality of holes formed therethrough, the holes each formed with a partition wall, first spring members urging the first slider member toward the base, a plurality of electrical contact members mounted on the base, each contact member having first and second elongated contact arms extending from the base and being movable toward and away from each other and having movable contact tips normally closely spaced from one another, the contact arms received through respective holes in the first slide member with the first and second contact arms of each contact member disposed on opposite sides of a respective partition wall, each contact arm being formed with a partition wall engagement surface normally disposed further from the base than the partition walls, a cover mounted on the base for movement toward and away from the base, the cover having a centrally located opening and having force transfer legs depending therefrom, the slider further comprising two second slide members disposed between the first slide member and the base with the second slide members disposed on opposite sides of the first slide member, the second slide members being movable toward and away from each other, second spring members urging the second slide members away from each other, the first slide member engaging the second slide members at engagement surfaces, the engagement surface of at least one of the first and second slide members being inclined relative to the base so that movement of the second slide members causes the first slide member to move toward or away from the base, the force transfer legs of the cover having a common surface aligned with and engaging the second slide members upon movement of the cover toward the base to push the second slide members toward each other which in turn causes the first slide member to move away from the base and the partition walls to move into engagement with the engagement surfaces of the contact arms to move the tips of the contact arms apart to allow seating or removal of an electronic package.

12. Socket apparatus according to claim 11 in which each contact member has a longitudinal axis and the contact arms of each contact member are symmetrical about the respective longitudinal axis, each partition wall engagement surface comprising a convex shaped portion facing in the direction of mutual approach of the respective contact arms.

13. Socket apparatus according to claim 12 in which the partition wall engagement surfaces are formed adjacent to the tips of the contact arms.

* * * * *